United States Patent [19]

Nakano

[11] Patent Number: 5,072,131
[45] Date of Patent: Dec. 10, 1991

[54] CIRCUIT FOR DETECTING ADDRESS SIGNAL TRANSITION

[75] Inventor: Takeshi Nakano, Osaka, Japan

[73] Assignee: Matsushita Electric Industrial Co., Ltd., Japan

[21] Appl. No.: 596,915

[22] Filed: Oct. 12, 1990

[30] Foreign Application Priority Data

Oct. 18, 1989 [JP] Japan .................. 1-271387

[51] Int. Cl.$^5$ ........................................... H03K 5/153
[52] U.S. Cl. .................................. 307/231; 307/517; 307/360; 328/132
[58] Field of Search ............... 307/356, 279, 350, 261, 307/360, 361, 362, 517, 231; 328/114, 132

[56] References Cited

U.S. PATENT DOCUMENTS 4,015,144  3/1977  Brouckaert .................. 307/261
4,342,965  8/1982  Baldwin ....................... 307/360
4,352,999  10/1982  Galpin .......................... 307/360
4,480,200  10/1984  Tan et al. ..................... 307/360
4,563,593  1/1986  Isobe et al. .................. 307/517

Primary Examiner—Stanley D. Miller
Assistant Examiner—Toan Tran
Attorney, Agent, or Firm—Lowe, Price, Leblanc & Becker

[57] ABSTRACT

A first device serves to sense a start of a transition of an address signal and to generate a transition start signal representative thereof. The first device has a first predetermined input switching voltage with respect to the address signal. A second device serves to sense an end of a transition of the address signal and to generate a transition end signal representative thereof. The second device has a second predetermined input switching voltage with respect to the address signal. The first and second predetermined input switching voltages are positively different from each other.

2 Claims, 3 Drawing Sheets

CIRCUIT FOR DETECTING ADDRESS SIGNAL TRANSITION

BACKGROUND OF THE INVENTION

This invention relates to a circuit for detecting an address signal transition which is usable in various devices such as a semiconductor memory device.

Some semiconductor memory devices are provided with circuits for detecting transitions of address signals. These circuits enable less rates of power consumption of the memory devices and also higher speeds of data reading. As will be explained later, a prior art circuit has a problem.

SUMMARY OF THE INVENTION

It is an object of this invention to provide an improved circuit for detecting an address signal transition.

According to a first aspect of this invention, a circuit for detecting a transition of an address signal comprises first means for sensing a start of a transition of the address signal and generating a transition start signal representative thereof, the first means having a first predetermined input switching voltage with respect to the address signal; and second means for sensing an end of a transition of the address signal and generating a transition end signal representative thereof, the second means having a second predetermined input switching voltage with respect to the address signal; wherein the first and second predetermined input switching voltages are positively different from each other.

According to a second aspect of this invention, a circuit for detecting a transition of an address signal comprises an address signal input line subjected to the address signal; a first circuit group having first, second, and third inverters, and a first delay circuit successively connected in series to the address signal input line; and a second circuit group having fourth and fifth inverters, and a second delay circuit successively connected in series to the address signal input line; wherein the first and fifth inverters output signals each representing a start of a transition of the address signal, and the first and second delay circuit output signals each representing an end of a transition of the address signal, and wherein the first and fourth inverters have first and second predetermined input switching voltages with respect to the address signal respectively, and the first and second predetermined input switching voltages are positively different from each other.

According to a third aspect of this invention, a circuit for detecting a transition of an address signal comprises first means for sensing a start of a transition of the address signal and generating a transition start signal representative thereof, the first means having a first predetermined input switching voltage with respect to the address signal; second means for sensing an end of a transition of the address signal and generating a transition end signal representative thereof, the second means having a second predetermined input switching voltage with respect to the address signal; and third means for generating an address selection signal on the basis of the address signal, the third means having a third predetermined input switching voltage with respect to the address signal; wherein the first, second, and third predetermined input switching voltages are positively different from each other, and the third predetermined input switching voltages lies between the first and second predetermined input switching voltages.

According to a fourth aspect of this invention, a circuit for detecting a transition of an address signal comprises an address signal input line subjected to the address signal; a first circuit group having first, second, and third inverters, and a first delay circuit successively connected in series to the address signal input line; a second circuit group having fourth and fifth inverters, and a second delay circuit successively connected in series to the address signal input line; and an address selector having a sixth inverter and a selection circuit successively connected in series to the address signal input line; wherein the first and fifth inverters output signals each representing a start of a transition of the address signal, and the first and second delay circuit output signals each representing an end of a transition of the address signal, and wherein the first, fourth, and sixth inverters have first, second, and third predetermined input switching voltages with respect to the address signal respectively, and the first, second, and third input switching voltages are positively different from each other and the third input switching voltage lies between the first and second predetermined input switching voltages.

DESCRIPTION OF THE PRIOR ART

Figure 1:
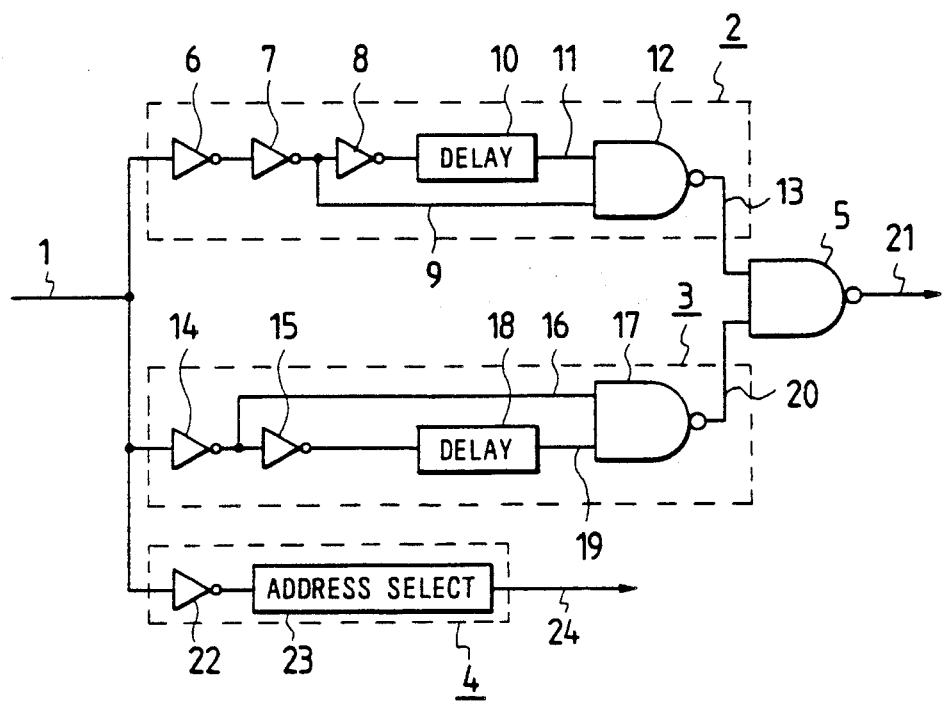
FIG. 1 is a block diagram of a prior art circuit for detecting an address signal transition.

FIG. 1 shows a prior art circuit for detecting an address signal transition. In the prior art circuit of FIG. 1, a bit of an address signal is fed via an address signal line 1 to a first transition detector 2 and a second transition detector 3. The bit of the address signal will be shortened to the address signal hereinafter. The first transition detector 2 serves to detect a transition of the address signal from a low level to a high level. The second transition detector 3 serves to detect a transition of the address signal from a high level to a low level. Output signals from the first and second transition detectors 2 and 3 are applied to input terminals of a NAND gate 5. The NAND gate 5 outputs a transition detection pulse signal which represents a transition of the address signal. The transition detection pulse signal is transmitted from the NAND gate 5 via an output signal line 21.

The first transition detector 2 includes a cascade combination of inverters 6, 7, and 8. The first transition detector 2 also includes a delay circuit 10 and a NAND gate 12. The input terminal of the first inverter 6 is connected to the address signal line 1. The output terminal of the third inverter 8 is connected to a first input terminal of the NAND gate 12 via the delay circuit 10. A line 11 connecting the delay circuit 10 and the NAND gate 12 is subjected to the output signal from the delay circuit 10 which represents detection end. The junction between the second and third inverters 7 and 8 is connected via a line 9 to a second input terminal of the NAND gate 12. The line 9 is subjected to the output signal from the second inverter 7 which represents detection start. The output signal from the NAND gate 12 is fed via an output signal line 13 to a first input terminal of the NAND gate 5.

The second transition detector 3 includes a cascade combination of inverters 14 and 15. The second transition detector 3 also includes a NAND gate 17 and a delay circuit 18. The input terminal of the first inverter 14 is connected to the address signal line 1. The output terminal of the second inverter 15 is connected to a first input terminal of the NAND gate 17 via the delay circuit 18. A line 19 connecting the delay circuit 18 and the NAND gate 17 is subjected to the output signal from the delay circuit 18 which represents detection end. The junction between the first and second inverters 14 and 15 is connected via a line 16 to a second input terminal of the NAND gate 17. The line 16 is subjected to the output signal from the first inverter 14 which represents detection start. The output signal from the NAND gate 17 is fed via an output signal line 20 to a second input terminal of the NAND gate In addition, the address signal is fed via the address signal line 1 to an address selector 4. The address selector 4 includes an inverter 22 and an address selection circuit 23. The input terminal of the inverter 22 is connected to the address signal line 1. The output terminal of the inverter 22 is connected to the input terminal of the address selection circuit 23. The address selection circuit 23 generates an address selection signal on the basis of the output signal from the inverter 22. The address selection signal is transmitted from the address selection circuit 23 via an output signal line 24. In general, the address selection circuit 23 is a part of a decoder.

The front end inverters 6, 14, and 22 of the first and second transition detectors 2 and 3, and the address selector 4 are designed so that their input switching voltages (threshold voltages) can be equal. These input switching voltages are denoted by the character Vs in the part (a) of FIG. 2.

The operation of the prior art circuit of FIG. 1 will be described hereinafter with reference to FIG. 2. A transition of the address signal from the low level to the high level is sensed by the first transition detector 2 as follows. An example of the waveform of the address signal is shown in the part (a) of FIG. 2. During the interval where the level of the address signal increases from its minimum, when the level of the address signal reaches the input switching voltage Vs of the inverter 6 of the first transition detector 2, the signal on the detection start signal line 9 changes from a low level to a high level. At this moment, since the signal on the detection end signal line 11 is maintained at a high level by the operation of the delay circuit 10, the level change of the signal on the detection start signal line 9 causes the output signal from the NAND gate 12 to change from a high level to a low level. After a time corresponding to the delay time of the delay circuit 10 elapses from this moment, the signal on the detection end signal line 11 changes from the high level to a low level so that the output signal from the NAND gate 12 returns to the high level. In this way, when the address signal changes from the low level to the high level, the NAND gate 12 of the first transition detector 2 outputs a transition detection short pulse signal (see the part (b) of FIG. 2) to the output signal line 13. It should be noted that the second transition detector 3 does not output any pulse when the address signal changes from the low level to the high level.

A transition of the address signal from the high level to the low level is sensed by the second transition detector 3 as follows. During the interval where the level of the address signal decreases from its maximum, when the level of the address signal reaches the input switching voltage Vs of the inverter 14 of the second transition detector 3, the signal on the detection start signal line 16 changes from a low level to a high level. At this moment, since the signal on the detection end signal line 19 is maintained at a high level by the operation of the delay circuit 18, the level change of the signal on the detection start signal line 16 causes the output signal from the NAND gate 17 to change from a high level to a low level. After a time corresponding to the delay time of the delay circuit 18 elapses from this moment, the signal on the detection end signal line 19 changes from the high level to a low level so that the output signal from the NAND gate 17 returns to the high level. In this way, when the address signal changes from the high level to the low level, the NAND gate 17 of the second transition detector 3 outputs a transition detection short pulse signal (see the part (c) of FIG. 2) to the output signal line 20. It should be noted that the first transition detector 2 does not output any pulse when the address signal changes from the high level to the low level.

The output pulse signals from the first and second transition detectors 2 and 3 are fed to the NAND gate 5 via the output signal lines 13 and 20. The NAND gate 5 executes the logic operation between the output pulse signals from the detectors 2 and 3. As a result, the NAND gate 5 outputs a composite address transition detection signal (see the part (d) of FIG. 2) containing positive short pulses, each of which occurs when the address signal changes from the low level to the high level or when the address signal changes from the high level to the low level. The composite transition detection pulse signal is transmitted from the NAND gate 5 via the output signal line 21.

The address selector 4 detects a transition of the address signal and generates an address selection signal in response to the detected transition. In cases where the level of the address signal increases from its minimum, when the level of the address signal reaches the input switching voltage Vs of the inverter 22 of the address selector 4, the output signal from the inverter 22 changes from a high level to a low level and also the output signal from the address selection circuit 23 changes from a low level to a high level in response to the level change of the output signal from the inverter 22. In cases where the level of the address signal decreases from its maximum, when the level of the address signal reaches the input switching voltage Vs of the inverter 22 of the address selector 4, the output signal from the inverter 22 returns to the high level and also the output signal from the address selection circuit 23 returns to the low level in response to the level change of the output signal from the inverter 22. As a result, the address selection circuit 23 outputs an address selection signal (see the part (e) of FIG. 2) whose state essentially corresponds to the state of the address signal. The address selection signal is transmitted from the address selection circuit 23 via the output signal line 24.

Figure 2:
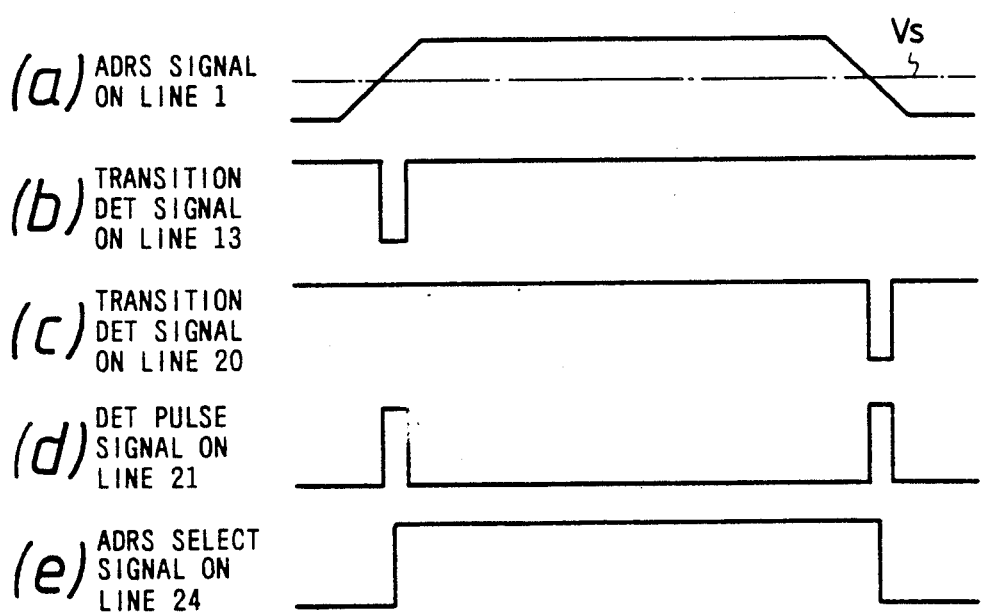
FIG. 2 is a timing diagram showing the waveforms of various signals in the prior art circuit of FIG. 1.

As shown in the parts (d) and (e) of FIG. 2, pulses of the address transition detection signal are synchronous with changes in the level of the address selection signal. For example, a pair of the address transition detection signal and the address selection signal are fed to various sections of a semiconductor memory device and are used in operations of pre-charging and resetting the sections.

In general, it is difficult to exactly equalize the input switching voltages of the inverters 6, 14, and 22. In other words, the input switching voltages of the inverters 6, 14, and 22 tend to slightly vary from each other. Such a variation in the input switching voltages of the inverters 6, 14, and 22 causes the address transition detection signal and the address selection signal to move out of good synchronization especially in cases where the level of the address signal gradually varies around the input switching voltages of the inverters 6, 14, and 22. A poor synchronization between the address transition detection signal and the address selection signal results in a low reliability of operation of a later device using these signals.

DESCRIPTION OF THE PREFERRED EMBODIMENT

Figure 3:
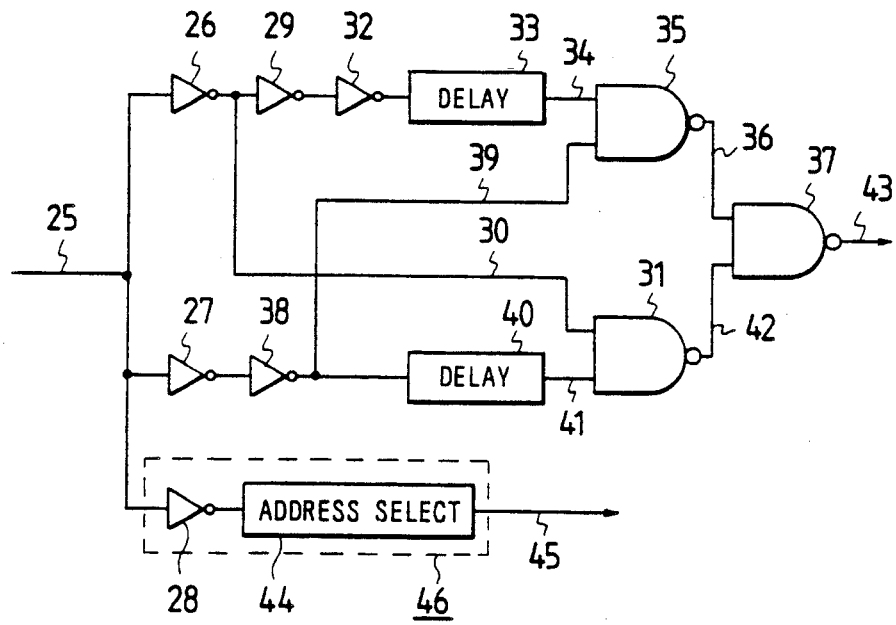
FIG. 3 is a block diagram of a circuit for detecting an address signal transition according to an embodiment of this invention.

FIG. 3 shows a circuit for detecting an address signal transition according to an embodiment of this invention. In the circuit of FIG. 3, a bit of an address signal is fed via an address signal line 25 to the input terminals of inverters 26 and 27. The bit of the address signal will be shortened to the address signal hereinafter. The output terminal of the inverter 26 is connected to the input terminal of an inverter 29. In addition, the output terminal of the inverter 26 is connected to a first input terminal of a NAND gate 31 via a line 30. The line 30 is subjected to the output signal from the inverter 26 which represents second-type detection start. The output terminal of the inverter 29 is connected to a first input terminal of a NAND gate 35 via an inverter 32 and a delay circuit 33. A line 34 connecting the delay circuit 33 and the NAND gate 35 is subjected to the output signal from the delay circuit 33 which represents first-type detection end. The NAND gate 35 outputs a first-type address transition detection signal to a first input terminal of a NAND gate 37 via an output signal line 36.

The output terminal of the inverter 27 is connected to the input terminal of an inverter 38. The output terminal of the inverter 38 is connected to the input terminal of a delay circuit 40. In addition, the output terminal of the inverter 38 is connected to a second input terminal of the NAND gate 35 via a line 39. The line 39 is subjected to the output signal from the inverter 38 which represents first-type detection start. The output terminal of the delay circuit 40 is connected to a second input terminal of the NAND gate 31 via a line 41. The line 41 is subjected to the output signal from the delay circuit 40 which represents second-type detection end. The NAND gate 31 outputs a second-type address transition detection signal to a second input terminal of the NAND gate 37 via an output signal line 42. The NAND gate 37 outputs a composite address transition detection pulse signal which is transmitted via an output signal line 43.

In addition, the address signal is fed via the address signal line 25 to an address selector 46. The address selector 46 includes an inverter 28 and an address selection circuit 44. The input terminal of the inverter 28 is connected to the address signal line 25. The output terminal of the inverter 28 is connected to the input terminal of the address selection circuit 44. The address selection circuit 44 generates an address selection signal on the basis of the output signal from the inverter 28. The address selection signal is transmitted from the address selection circuit 44 via an output signal line 45. In general, the address selection circuit 44 is a part of a decoder.

The front-end inverters 26, 27, and 28 have predetermined input switching voltages (threshold voltages) V26, V27, and V28 respectively. As shown in the part (a) of FIG. 4, the input switching voltages V26, V27, and V28 are chosen so that the voltage V28 is higher than the voltage V27 but lower than the voltage V26. In other words, the following relation is satisfied: $V26 > V28 > V27$.

Figure 5:
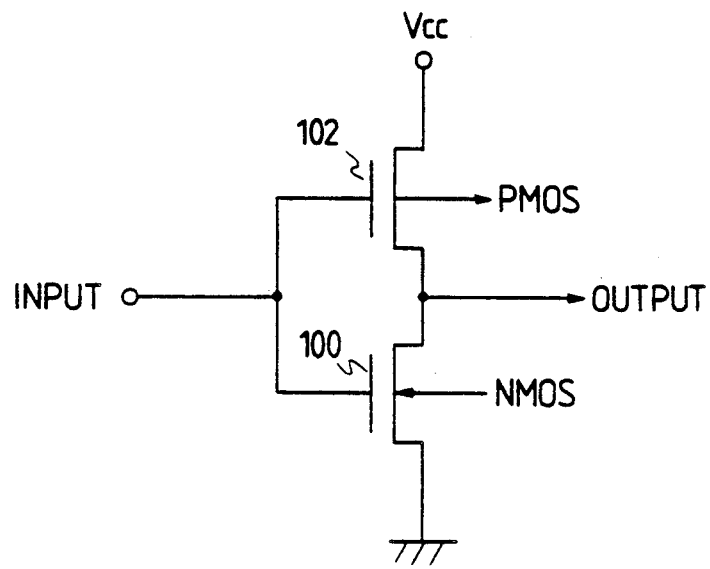
FIG. 5 is a schematic diagram of the inverters of FIG. 3.
Figure 6:
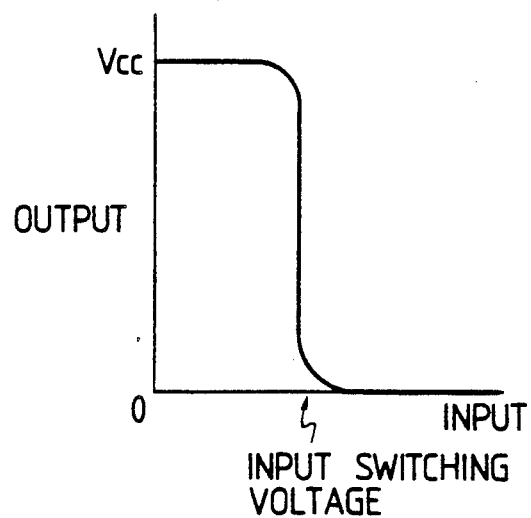
FIG. 6 is a diagram showing the input-output characteristic of the inverter of FIG. 5.

As shown in FIG. 5, each of the inverters 26, 27, and 28 is formed by a CMOS circuit including a combination of an NMOS transistor 100 and a PMOS transistor 102. The gates of the NMOS transistor 100 and the PMOS transistor 102 are connected in common to an inverter input terminal. The source-drain paths of the NMOS transistor 100 and the PMOS transistor 102 are connected in series. The series combination of the source-drain paths is connected between the ground and a positive voltage line Vcc. The intermediate point in the series combination of the source-drain paths is connected to an inverter output terminal. As shown in FIG. 6, the inverter output voltage changes at a predetermined input voltage, that is, an input switching voltage.

In the inverter of FIG. 5, the input switching voltage is determined by the drive abilities of the NMOS transistor 100 and the PMOS transistor 102. As the current ability of the NMOS transistor 100 increases, the input switching voltage decreases. As the current ability of the PMOS transistor 102 increases, the input switching voltage increases. The current ability of each of the NMOS transistor 100 and the PMOS transistor 102 depends on the value equal to its effective area width divided by its effective area length. Therefore, the input switching voltage depends on the sizes (the effective area widths and the effective area lengths) of the NMOS transistor 100 and the PMOS transistor 102.

The sizes of NMOS transistors and PMOS transistors in the inverters 26, 27, and 28 are chosen so that the inverters 26, 27, and 28 will have the input switching voltages V26, V27, and V28 which satisfy the relation "$V26 > V28 > V27$".

Figure 4:
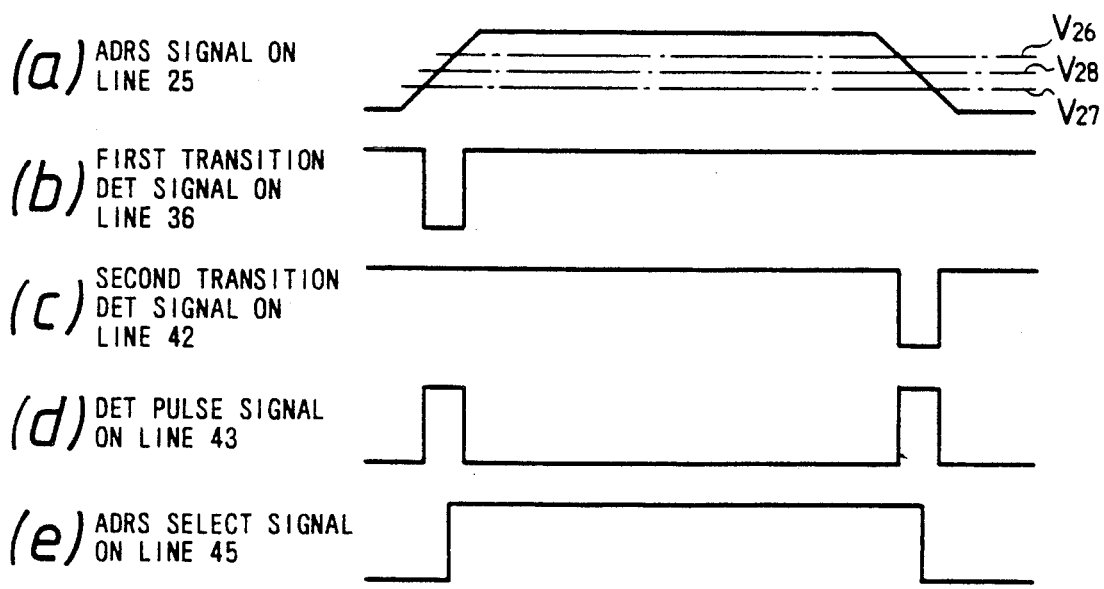
FIG. 4 is a timing diagram showing the waveforms of various signals in the circuit of FIG. 3.

The operation of the circuit of FIG. 3 will be described hereinafter with reference to FIG. 4. A transition of the address signal from the low level to the high level is sensed as follows. An example of the waveform of the address signal is shown in the part (a) of FIG. 4. During the interval where the level of the address signal increases from its minimum, when the level of the address signal reaches the input switching voltage V27 of the inverter 27, the signal on the first-type detection start signal line 39 changes from a low level to a high level. Thereafter, when the level of the address signal reaches the input switching voltage V28 of the inverter 28, the address selection signal outputted from the address selection circuit 44 to the output line 45 changes from a low level to a high level as shown in the part (e) of FIG. 4. Then, the level of the address signal further increases and reaches the input switching voltage V26 of the inverter 26. After a time basically corresponding to the delay time of the delay circuit 33 elapses from this moment, the signal on the first-type detection end signal line 34 changes from a high level to a low level. Here, an attentional description will be given of the signals inputted to the NAND gate 35. At the moment of the low-to-high change of the signal on the first-type detection start signal line 39, since the signal on the first-type detection end signal line 34 is maintained at the high level, the output signal from the NAND gate 35 changes from a high level to a low level. At the later moment of the high-to-low change of the signal on the first-type detection end signal line 34, the output signal from the NAND gate 35 returns to the high level. In this way, when the address signal changes from the low level to the high level, the NAND gate 35 outputs a first-type transistion detection short pulse signal (see the part (b) of FIG. 4) to the output signal line 36. The width of a pulse in the first-type transition detection signal is determined by factors such as the difference between the input switching voltages V26 and V27 of the inverters 26 and 27, the delay time of the delay circuit 33, and the rate of the increase in the level of the address signal. Accordingly, the difference between the input switching voltages V26 and V27 of the inverters 26 and 27, and the delay time of the delay circuit 33 are chosen so as to realize a suitable width of a pulse of the first-type transition detection signal. Since the input switching voltage V28 of the address selector 46 lies between the input switching voltages V26 and V27 of the inverters 26 and 27 in the transition detecting part, the moment of the low-to-high change of the address selection signal is always present within the interval corresponding to the duration of the pulse in the first-type address transition detection signal as shown in the parts (b) and (e) of FIG. 4. Thus, in respect of a transition of the address signal from the low level to the high level, the address selection signal and the first-type address transition detection signal are accurately synchronized with each other. It should be noted that the NAND gate 31 does not output any pulse when the address signal changes from the low level to the high level.

A transition of the address signal from the high level to the low level is sensed as follows. During the interval where the level of the address signal decreases from its maximum, when the level of the address signal reaches the input switching voltage V26 of the inverter 26, the signal on the second-type detection start signal line 30 changes from a low level to a high level. Thereafter, when the level of the address signal reaches the input switching voltage V28 of the inverter 28, the address selection signal outputted from the address selection circuit 44 to the output line 45 changes from the high level to the low level as shown in the part (e) of FIG. 4. Then, the level of the address signal further increases and reaches the input switching voltage V27 of the inverter 27. After a time basically corresponding to the delay time of the delay circuit 40 elapses from this moment, the signal on the second-type detection end signal line 41 changes from a high level to a low level. Here, an attentional description will be given of the signals inputted to the NAND gate 31. At the moment of the low-to-high change of the signal on the second-type detection start signal line 30, since the signal on the second-type detection end signal line 41 is maintained at the high level, the output signal from the NAND gate 31 changes from a high level to a low level. At the later moment of the high-to-low change of the signal on the second-type detection end signal line 41, the output signal from the NAND gate 31 returns to the high level. In this way, when the address signal changes from the high level to the low level, the NAND gate 31 outputs a second-type transition detection short pulse signal (see the part (c) of FIG. 4) to the output signal line 42. The width of a pulse in the second-type transition detection signal is determined by factors such as the difference between the input switching voltages V26 and V27 of the inverters 26 and 27, the delay time of the delay circuit 40, and the rate of the decrease in the level of the address signal. Accordingly, the difference between the input switching voltages V26 and V27 of the inverters 26 and 27, and the delay time of the delay circuit 40 are chosen so as to realize a suitable width of a pulse of the second-type transition detection signal. Since the input switching voltage V28 of the address selector 46 lies between the input switching voltages V26 and V27 of the inverters 26 and 27 in the transition detecting part, the moment of the high-to-low change of the address selection signal is always present within the interval corresponding to the duration of the pulse in the second-type address transition detection signal as shown in the parts (c) and (e) of FIG. 4. Thus, in respect of a transition of the address signal from the high level to the low level, the address selection signal and the second-type address transition detection signal are accurately synchronized with each other. It should be noted that the NAND gate 35 does not output any pulse when the address signal changes from the high level to the low level.

The first-type and second-type address transition detection signals are fed from the NAND gates 31 and 35 to the NAND gate 37 via the output signal lines 42 and 36. The NAND gate 37 executes the logic operation between the output pulse signals from the NAND gates 31 and 35. As a result, the NAND gate 37 outputs a composite address transition detection signal (see the part (d) of FIG. 4) containing positive short pulses, each of which occurs when the address signal changes from the low level to the high level or when the address signal changes from the high level to the low level. The composite transition detection pulse signal is transmitted from the NAND gate 37 via the output signal line 43.

As understood from the previous description, there are two different (slightly-offset) input switching voltages for sensing a start and an end of a transition of the address signal respectively. Accordingly, it is possible to reliably detect a start and an end of a transition of the address signal. It should be noted that the prior art circuit of FIG. 1 uses a single input switching voltage for sensing a start and an end of a transition of an address signal.

As described previously, the input switching voltage V28 of the address selector 46 lies between the input switching voltages V26 and V27 of the inverters 26 and 27 in the transition detecting part. Accordingly, even in the case of a very slow transition of the address signal, it is possible to accurately synchronize the address selection signal outputted from the address selection circuit 44 and the composite address transition detection pulse signal outputted from the NAND gate 37.

What is claimed is:

1. A circuit for detecting a transition of an address signal, comprising:
    an address signal input line subjected to the address signal;

a first circuit group having first, second, and third inverters, and a first delay circuit successively connected in series to the address signal input line; and a second circuit group having fourth and fifth inverters, and a second delay circuit successively connected in series to the address signal input line;

wherein the first and fifth inverters output signals each representing a start of a transition of the address signal, and the first and second delay circuits output signals each representing an end of a transition of the address signal, and wherein the first and fourth inverters have first and second predetermined input switching voltages with respect to the address signal respectively, and the first and second predetermined input switching voltages are positively different from each other.

2. A circuit for detecting a transition of an address signal, comprising:

an address signal input line subjected to the address signal;

a first circuit group having first, second, and third inverters, and a first delay circuit successively connected in series to the address signal input line;

a second circuit group having fourth and fifth inverters, and a second delay circuit successively connected in series to the address signal input line; and an address selector having a sixth inverter and a selection circuit successively connected in series to the address signal input line;

wherein the first and fifth inverters output signals each representing a start of a transition of the address signal, and the first and second delay circuits output signals each representing an end of a transition of the address signal, and wherein the first, fourth, and sixth inverters have first, second, and third predetermined input switching voltages with respect to the address signal respectively, and the first, second, and third input switching voltages are positively different from each other and the third input switching voltage lies between the first and second predetermined input switching voltages.

* * * * *